United States Patent
Ye et al.

(10) Patent No.: US 10,574,437 B1
(45) Date of Patent: Feb. 25, 2020

(54) APPARATUS AND METHOD FOR SYNCHRONIZATION OF GLOBAL NAVIGATION SATELLITE SYSTEM SIGNAL SYNCHRONIZATION IN A NOISY ENVIRONMENT

(71) Applicant: Honeywell International Inc., Morris Plains, NJ (US)

(72) Inventors: Ping Ye, Shang Hai (CN); Xiao Cao, Shanghai (CN); Brian Schipper, Brooklyn Park, MN (US)

(73) Assignee: Honeywell International Inc., Morris Plains, NJ (US)

( * ) Notice: Subject to any disclaimer, the term of this patent is extended or adjusted under 35 U.S.C. 154(b) by 0 days.

(21) Appl. No.: 16/364,843

(22) Filed: Mar. 26, 2019

(51) Int. Cl.
*H04L 7/04* (2006.01)
*H04L 1/00* (2006.01)
*H03M 13/15* (2006.01)
*H04L 7/00* (2006.01)

(52) U.S. Cl.
CPC .......... *H04L 7/048* (2013.01); *H03M 13/152* (2013.01); *H04L 1/0045* (2013.01); *H04L 7/0087* (2013.01)

(58) Field of Classification Search
CPC .................................................. H04L 7/048
USPC ........................................................ 375/367
See application file for complete search history.

(56) References Cited

U.S. PATENT DOCUMENTS

| | | | |
|---|---|---|---|
| 6,380,891 B1 | 4/2002 | Yamashita | |
| 7,006,790 B2 | 2/2006 | Bloebaum et al. | |
| 7,064,709 B1 | 6/2006 | Weisenburger et al. | |
| 7,257,153 B2 | 8/2007 | Kontola | |
| 7,453,926 B2 | 11/2008 | Chen et al. | |
| 7,778,311 B2 | 8/2010 | Jia et al. | |
| 8,116,354 B2 * | 2/2012 | Chen ...................... | G01S 19/30 327/141 |
| 8,618,978 B2 | 12/2013 | Torimoto et al. | |
| 9,209,893 B2 | 12/2015 | Lee et al. | |
| 9,255,994 B2 | 2/2016 | Young | |
| 9,287,921 B2 | 3/2016 | Youssef et al. | |
| 9,671,497 B2 | 6/2017 | Ashjaee et al. | |
| 2012/0293369 A1 | 11/2012 | Liu et al. | |
| 2012/0319899 A1 | 12/2012 | Tangudu et al. | |
| 2014/0062766 A1 | 3/2014 | Zou et al. | |

FOREIGN PATENT DOCUMENTS

| | | |
|---|---|---|
| CN | 103901444 B | 12/2015 |
| WO | 2014079133 A1 | 5/2014 |

OTHER PUBLICATIONS

BeiDou Navigation Satellite System, "Signal in Space Interface Control Document, Open Service Signal B1C (Version 1.0)", China Satellite Navigation Office, Published: Dec. 2017, pp. 1-87.
Global Positioning Systems Directorate Systems Engineering and Integration, "Interface Specification IS-GPS-800", Navstar GPS Space Segment/User Segment L1C Interface, Published Sep. 24, 2013, pp. 1-127.

* cited by examiner

*Primary Examiner* — Lihong Yu
(74) *Attorney, Agent, or Firm* — Fogg & Powers LLC

(57) ABSTRACT

A method and apparatus are provided for performing consistency testing for a Bose-Chaudhuri-Hocquenghem (BCH) error corrected first sub-frame of navigation message broadcast from a satellite of a GNSS. Consistency testing is performed by comparing BCH encoded portion(s)s of data symbols with elements of look up table(s) to see if such portions are similar to element(s) of the look up table(s).

16 Claims, 5 Drawing Sheets

APPARATUS AND METHOD FOR SYNCHRONIZATION OF GLOBAL NAVIGATION SATELLITE SYSTEM SIGNAL SYNCHRONIZATION IN A NOISY ENVIRONMENT

BACKGROUND

Each satellite in a constellation of satellites of a global navigation satellite system (GNSS) emits a unique signal. A GNSS receiver must receive multiple such signals to determine time, and position and velocity of the GNSS receiver.

Each GNSS signal comprises a pilot component and a data component. The pilot component comprises a carrier signal encoded with a primary pseudorandom noise (PRN) ranging code and a secondary ranging code. The data component comprises a carrier signal encoded with a primary pseudorandom noise (PRN) ranging code and a navigation message.

A received GNSS satellite signal, including the navigation message, may be corrupted due to noise in the communications link between a satellite and the GNSS receiver. To permit GNSS receivers to detect at least partially corrupted navigation message, GNSSs—such as Global Positioning System (GPS) and the BeiDou Navigation Satellite System (BDS)—are applying error correction coding to the navigation message encoded in data component. For example, GPS and BDS are respectively applying error correction coding to all or a portion of the data encoded in the navigation message respectively of the GPS L1C and the BDS B1C signals. For GPS and BeiDou, Bose-Chaudhuri-Hocquenghem (BCH) error correction coding is applied to a portion of the navigation message to permit error detection and correction.

To ensure existing and modern GNSS receivers can more robustly detect GNSS satellite signals in noisy environments, there is a need to cost effectively and efficiently implement synchronization of error corrected navigation message in such GNSS receivers.

SUMMARY

A method performed by a global navigation satellite system (GNSS) receiver is provided. The method comprises: downconverting a pilot component and a data component of a GNSS satellite signal, where the pilot signal comprises a carrier signal encoded with a unique pseudorandom noise (PRN) ranging code, and where the PRN ranging code comprises a primary code, unique to a corresponding satellite, and a secondary code; wherein the data component comprises a carrier signal encoded with a primary pseudorandom noise (PRN) ranging code and a navigation message; synchronizing a downconverted pilot component with the primary code; synchronizing the downconverted pilot component with the secondary code; determining a PRN identifier for the navigation message; demodulating a data symbol from the navigation message; generating, using Bose-Chaudhuri-Hocquenghem (BCH) coding, a first look up table of a set of all possible combinations of potentially received BCH encoded time information having zero bit errors, where the potentially received BCH encoded time information are in a first sub-frame of a frame of the navigation message; sampling at least i bits of the data symbol; determining if a set of i bits, from bit b to bit c, of the data symbol similar to an element in the first look up table but for having t or fewer bit errors, where he set of i bits corresponds to BCH encoded time information; determining frame count data and frame synchronization data; if the set of i bits corresponds is similar to an element in the first look up table, then generating at least a decoded navigation message based upon the frame count data and the frame synchronization sign data; generating at least a position of a GNSS satellite using at least the decoded navigation message; and if the set of i bits of the data symbol is determined not to be an element in the first look up table, then incrementing the set of i bits by one bit to range from bit b+1 to bit c+1 of the data symbol.

DRAWINGS

Understanding that the drawings depict only exemplary embodiments and are not therefore to be considered limiting in scope, the exemplary embodiments will be described with additional specificity and detail through the use of the accompanying drawings, in which.

In accordance with common practice, the various described features are not drawn to scale but are drawn to emphasize specific features relevant to the exemplary embodiments. Reference characters denote like elements throughout figures and text.

DETAILED DESCRIPTION

Figure 1:
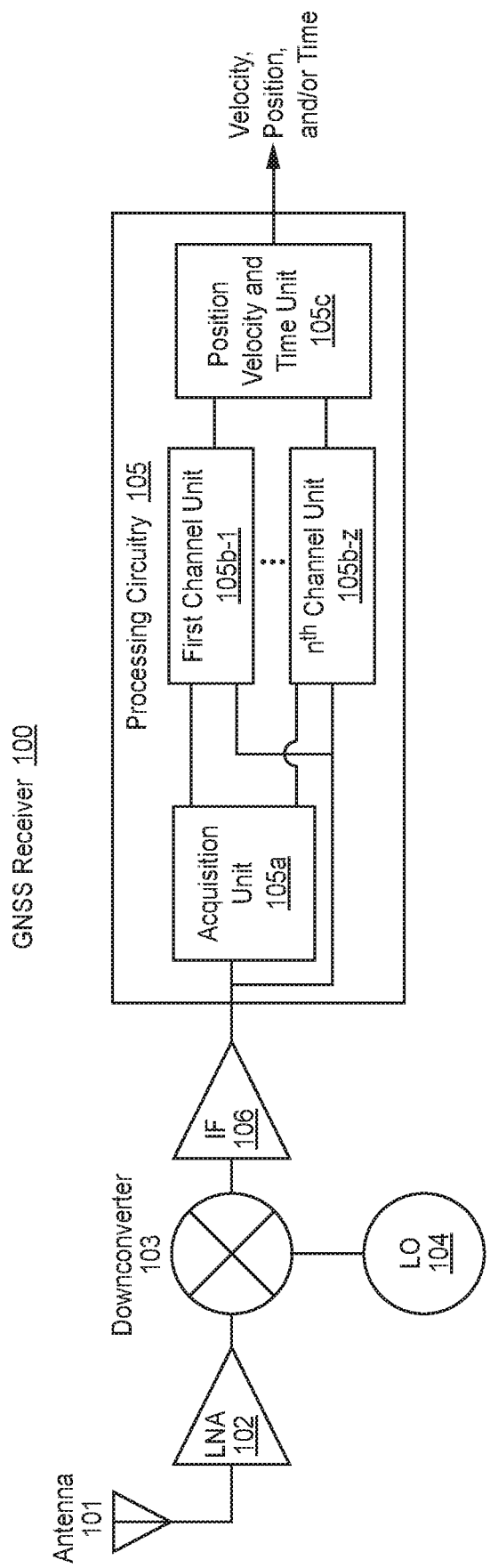
FIG. 1 illustrates one embodiment of a GNSS receiver 100 employing consistency testing for a BCH error corrected first sub-frame of navigation message broadcast from a satellite of a GNSS.

In the following detailed description, reference is made to the accompanying drawings that form a part hereof, and in which is shown by way of illustration specific illustrative embodiments. However, it is to be understood that other embodiments may be utilized, and that structural, mechanical, and electrical changes may be made. Furthermore, the method presented in the drawing figures and the specification is not to be construed as limiting the order in which the individual steps may be performed. The following detailed description is, therefore, not to be taken in a limiting sense.

A GNSS receiver efficiently synchronizes to an error corrected navigation message encoded in a data component of GNSS signal as will be subsequently described. Two GNSSs, BeiDou and GPS, will be exemplified herein for pedagogical reasons.

Both BeiDou and GPS transmit the pilot and data components in the GNSS signal. The PRN ranging code encoded on the pilot component comprises a primary code and a secondary code. The primary code is a PRN uniquely associated with the satellite that broadcasts data encoded with the PRN code.

The GNSS receiver has channels each of which must be synchronized to the primary and secondary codes of a corresponding satellite before decoding error corrected navigation message from the corresponding satellite. A channel first synchronizes to a primary code and then to a secondary code of the corresponding satellite. Then, each GNSS receiver channel synchronizes to the frames of the navigation message (all or a portion of which may be encoded with error corrected coding). Upon attaining synchronization to the frames of the navigation message, the GNSS receiver channel extracts time and satellite position data from the satellite signal.

BCH error correction coding will be exemplified herein for pedagogical purposes. However, other error correction codes can be used.

The navigation message includes frames of navigation data. In BeiDou and GPS, the total number of bits in a frame is 1800.

Each frame comprises three sub-frames including timing, ephemeris, almanac, and atmospheric data. Such ephemeris data includes information about the satellite location. The frame has a known number of bits. Each sub-frame has a known number of bits. The PRN ranging code and navigation message formats are defined by an interface control document (ICD) for the corresponding GNSS. The encoded navigation message in each frame is coded with BCH error corrected coding when transmitted from a satellite.

For either system, the GNSS receiver channel synchronizes to the first sub-frame of the navigation message because only the first sub-frame is encoded with BCH. By synchronizing to the first sub-frame, the GNSS receiver channel synchronizes to the frame including the first sub-frame.

Note, any number of sub-frames may be encoded with error corrected coding. For example, GPS and BeiDou utilize low density parity check coding in at least one sub-frame following the first sub-frame in addition to BCH encoding in the first sub-frame.

In BeiDou, the first sub-frame of the navigation message comprises 72 bits. The first 21 bits comprise a unique PRN number or identifier corresponding to a unique satellite of the GNSS. The last 51 bits comprise a time indicator, second of hour (SOH). For BeiDou, the GNSS receiver channel synchronizes to both the PRN and the SOH. The PRN and SOH are separately BCH error corrected coded.

In GPS, the first sub-frame of error corrected coded data comprises 9 bits. The 9 bits comprise a time indicator, time of interval (TOI). For GPS, the GNSS receiver channel synchronizes to the TOI. Each of PRN, SOH, and TOI may be subsequent referred to hereafter as a segment, e.g. of a sub-frame.

BCH error correction codes are designed to correct a up to R number of bit errors in corresponding data; R is an integer greater than or equal to one. To perform synchronization, a table of all combinations of possibly received segments is created, where each possibly received segment has S bits (where S is defined in the corresponding ICD) and between zero and R bit errors. Consistency testing is performed for a set of S bits (ranging from bit f to bit g) of the error corrected navigation message by comparing the set with each possibly received segment in the table.

If there is no match, the next set of data (i.e. ranging from bit f+1 to bit g+1) is so analyzed. The next sequential set of error corrected coded data is formed by dropping the first bit a and adding a bit in the error corrected navigation message that immediately follows the last bit b. For example, this may be performed using FIFO registers.

If there is a match, then for the next L frames, determine whether there is a match for the same set of bits (i.e. ranging from bit f to bit g) in the frames of the error corrected coded data. L is an integer greater than or equal to one, and may be selected by a designer of the GNSS receiver. If there is a match for the same set of bits for the next frames, then the location of the segment is obtained, and synchronization can be achieved. This technique may be efficiently retrofitted into existing GNSS receivers with a software update.

An exemplary system for implementing the foregoing in a GNSS receiver will now be described. FIG. 1 illustrates one embodiment of a GNSS receiver 100 employing consistency testing for a BCH error corrected first sub-frame of navigation message broadcast from a satellite of a GNSS. The GNSS receiver 100 comprises a low noise amplifier (LNA) 102, a downconverter 103, a local oscillator (LO) 104, and processing circuitry 105.

The LNA has a relatively low noise figure at carrier frequencies, e.g. 1575.42 MHz, of the pilot and the data components in GNSS signal. Thus, LNA improves the noise figure of the processing circuitry 105 and corresponding tracking channels. An output of the LNA 102 is coupled to a first input of the downconverter 103.

A local oscillator (LO) 104 is coupled to a second input of the downconverter 103. The local oscillator 103 generates a continuous wave (CW) signal typically at a frequency lower than the carrier frequency of the GNSS signal. The output of the downconverter 103 is coupled to an input of the processing circuitry 105.

The downconverter 103 is configured to provide an intermediate frequency (IF) signal at an output of the downconverter 103. The carrier frequency of the intermediate frequency signal is the difference between the carrier frequency (of the GNSS signal) and the frequency of the CW signal generated by the local oscillator 104. The IF signal comprises a downconverted pilot component and a downconverted data component.

Optionally, the GNSS receiver includes an intermediate frequency amplifier (IF) 106. The intermediate frequency amplifier 106 is coupled between the output of the downconverter 103 and the input of the processing circuitry 105. Optionally, the GNSS receiver 100 includes at least one antenna 101 which is coupled to an input of the LNA 102.

The processing circuitry 105 comprises an acquisition unit (or circuitry) 105a, z channel units 105b-1, 105b-z, and a position, velocity, and time determination unit 105c. z is an integer greater than one. An input of the acquisition unit 105a is configured to be coupled to an output of the downconverter 103 (or the optional intermediate frequency amplifier 106), and receive the IF signal. The processing circuitry 105 can be a state machine or a neural network.

The acquisition unit 105a is configured to synchronize the downconverted pilot component in the IF signal with a primary code uniquely corresponding to the GNSS satellite broadcasting the pilot and the data components in GNSS signal being processed by the GNSS receiver 100. For example, the processing circuitry 105 comprises a lookup table of primary codes (specified by the ICD) for all satellites in the GNSS; the acquisition unit 105a attempts to synchronized to each such primary code. This synchronization may be performed utilizing phase locking techniques and using the known primary codes. Upon obtaining synchronization with a particular primary code, the acquisition unit 105a determines a PRN identifier (PRN ID) of the corresponding satellite, Doppler velocity data, a primary code chip data, and a channel identifier (channel ID). Corresponding PRN identifier and primary code chip data may be obtained from the aforementioned (or another) look up table including such information for each satellite in the GNSS constellation and which is defined in the ICD. Upon synchronization with the primary code, the acquisition unit 105*a* removes the primary code from the downconverted pilot component and the downconverted data component.

The PRN identifier is PRN used to encode the data component; the PRN identifier differs from the primary code of the pilot component. The PRN identifier is used to extract data from the downconverted data component. The primary code chip data provides the period or the number of bits in the primary code.

Doppler data provides information about a velocity component along the line of sight of the receiver relative to the satellite. The velocity component is computed as a function of the frequency offset from the nominal carrier frequency. Depending upon the velocity of the GNSS receiver, the velocity component may cause a frequency offset, from the nominal carrier frequency of the GNSS signal (and thus the downconverted pilot component and the downconverted data component).

The operation described above for the acquisition unit 105 is performed, e.g. sequentially or in parallel, for one or more other channel units of the GNSS receiver 100. Although a single set of a LNA 102, a downconverter 103, a local oscillator 104, a primary code acquisition circuitry 105, and optionally an IF amplifier 106 and at least one antenna 101 are illustrated as performing the foregoing signal processing function, in other embodiments each channel unit can be coupled to a unique set of a LNA, a downconverter, a local oscillator, a primary code acquisition circuitry, IF amplifier, and/or at least one antenna.

The acquisition unit 105*a* assigns a unique channel unit to further process the downconverted pilot and data components corresponding to a unique satellite. When doing so, it generates a channel identifier uniquely assigned to that channel unit. The channel unit, associated with a channel identifier, is configured to receive the corresponding PRN identifier, Doppler velocity data, and primary code chip data. Each channel unit is configured to decode navigation message in a downconverted data component broadcast from the corresponding satellite. The output of each channel unit is configured to be coupled to an input of a position, velocity, and time determination unit 105*c* and to provide the corresponding PRN identifier, channel unit decoding status, and decoded navigation message. The position, velocity, and time determination unit 105*c* is configured to receive the corresponding PRN identifier, the channel unit decoding status, and the decoded navigation message. The position, velocity, and time determination unit 105*c* is further configured to determine the location and velocity of the GNSS receiver and current time using the information provided by each channel unit. Velocity can be determined by analyzing change in distance with respect to time.

Figure 2:
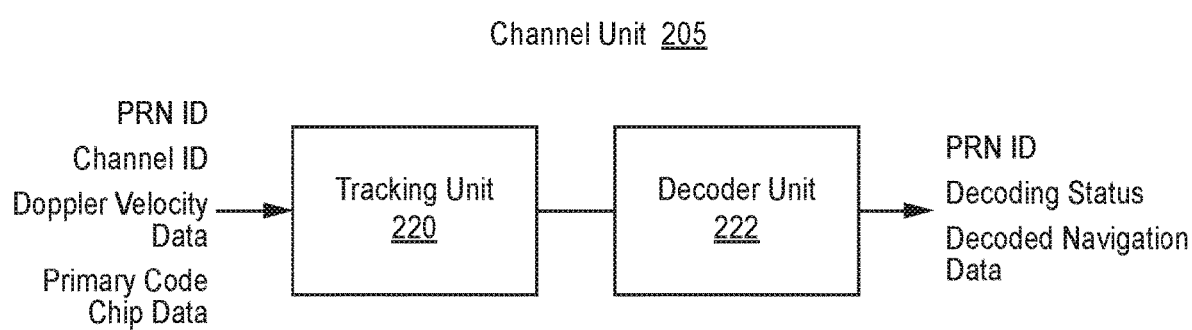
FIG. 2 illustrates a block diagram of one embodiment of a channel unit.

FIG. 2 illustrates a block diagram of one embodiment of a channel unit 205. The channel unit 205 comprises a tracking unit 220 and a decoder unit 222. The input of the channel unit 205, and hence the input of the tracking unit 220, is configured to be coupled to an output of the acquisition unit 105*a*, and the output of the downconverter 103 (or the IF amplifier 106). The input of the channel unit 205, and hence the input of the tracking unit 220, is configured to receive the downconverted pilot component and the downconverted data signal from the downconverter 103 (or the IF amplifier 106). The input of the channel unit 205, and hence the input of the tracking unit 220, is also configured to receive the PRN identifier, the channel identifier, the Doppler velocity data, and the primary code chip data from the acquisition unit 105*a*.

The tracking unit 220 is configured to demodulate data from the downconverted data component, and tracking unit 220 utilizes, e.g. a Phase Locked Loop (PLL) and Delay Locked Loop (DLL) to respectively track carrier phase and code phase. One data symbol means the sign of coherent integrated value in one primary code period (for B1C, it is a period of 10 ms); the frame of the navigation message includes a first sub-frame encoded with BCH. A data symbol means a frame length of navigation message data.

Operation of the tracking unit 220 will now be described. The tracking unit 220 is configured to provide the PRN identifier and a data symbol at the output of the tracking unit 220.

Optionally, the tracking unit 220 selects one tracking channel upon receipt of a new set of a PRN identifier, Doppler data, and primary code chip data. When performing such demodulation, the tracking unit 220 uses the primary code chip data to synchronize to the secondary code in the PRN ranging code of the downconverted pilot component. The chip width of the secondary code has the same length as one period of a primary code, and the start of a secondary code chip is strictly aligned with the start of the first chip of a primary code.

Because the primary code chip has a period equal to that of the data symbol, the commencement of a primary code chip indicates the occurrence of the data symbol. Thus, by detecting the commencement of a primary code chip in the secondary code, the commencement of the frame or the data symbol is known. Further, when performing demodulation, the tracking unit 220 uses the Doppler data to track changes in the IF carrier frequency using phase and/or frequency locking.

The decoder unit 222 is configured to provide at least decoded navigation message. The operation of the decoder unit 222 will now be described.

The decoder unit 222 has an input configured to be coupled to the output of the tracking unit 220 and to receive the corresponding PRN identifier and data symbol from the tracking unit 220. The decoder unit 222 has an output configured to be coupled to an input of the position, velocity, and time determination unit 105*c*. The output of the decoder unit 222 is configured to provide the PRN identifier, decoding status data, and decoded navigation message. The decoding status data indicates whether the decoding unit 222 has decoded navigation message. In one embodiment, the decoded navigation message comprises ephemeris, almanac and atmospheric correction data. The position, velocity, and time determination unit 105 can use decoding status data to ensure that one satellite's ephemeris has been received; if position, velocity, and time determination unit 105 has received sufficient satellites' data, it can determine time, GNSS receiver velocity, and/or GNSS receiver position within a predetermined accuracy level. GNSS receiver position may be determined by multilateration using the position of multiple satellites obtained from multiple channels of the GNSS receiver 100.

Figure 3:
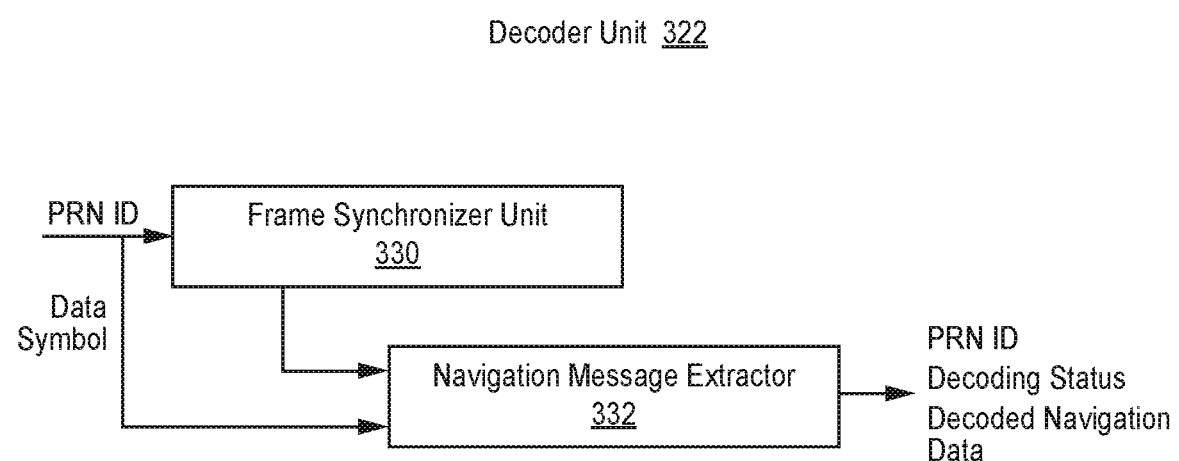
FIG. 3 illustrates a block diagram of an exemplary embodiment of a decoder unit.

FIG. 3 illustrates a block diagram of an exemplary embodiment of a decoder unit 322. The decoder unit 322 comprises a frame synchronizer 330 and a navigation message extractor unit 332. Because each data symbol (or frame) comprises sub-frames, e.g. three sub-frames, the frame synchronizer is used to determine where each sub-frame commences. The frame synchronizer 330 is configured to receive the PRN identifier and the data symbol and generates frame count data and frame synchronization sign data. The frame count data indicates the bit location in the data symbol of a first bit of the first sub-frame (or the range of bits locations of the first sub-frame); the frame count data may provide similar information for other sub-frames in a frame. The frame synchronization sign data indicates whether or not the frame synchronizer 330 has identified at least the first sub-frame, and thus synchronized to at least the first sub-frame of a data symbol. Because each sub-frame has a known bit length (specified in the ICD), upon synchronizing to the first sub-frame, synchronization to all other sub-frames is achieved. The frame count data and the frame synchronization sign data can then be used to extract decoded navigation message from the data symbol.

For BeiDou, the number of bits in a frame of the error corrected coded navigation message is 1800 bits. The frame comprises three sub-frames having respectively 72 bits, 1200 bits, and 528 bits. For this embodiment, when decoded, the frame has 878 bits, where the three sub-frames respectively have 14 bits, 600 bits, and 264 bits. The first sub-frame consists of a 6 bit PRN and a 8 bit SOH. The number of bits of the frame and each sub-frame, and frame structure design can vary in other embodiments. As discussed above, for GPS, the first sub-frame of error corrected coded data comprises 9 bits of the time indicator, time of interval.

The navigation message extractor 222 is configured to receive the PRN identifier, the data symbol, the frame count, and the frame synchronization sign. The navigation message extractor 222 uses such information to correctly and efficiently extract the navigation message from the data symbol.

Figure 4:
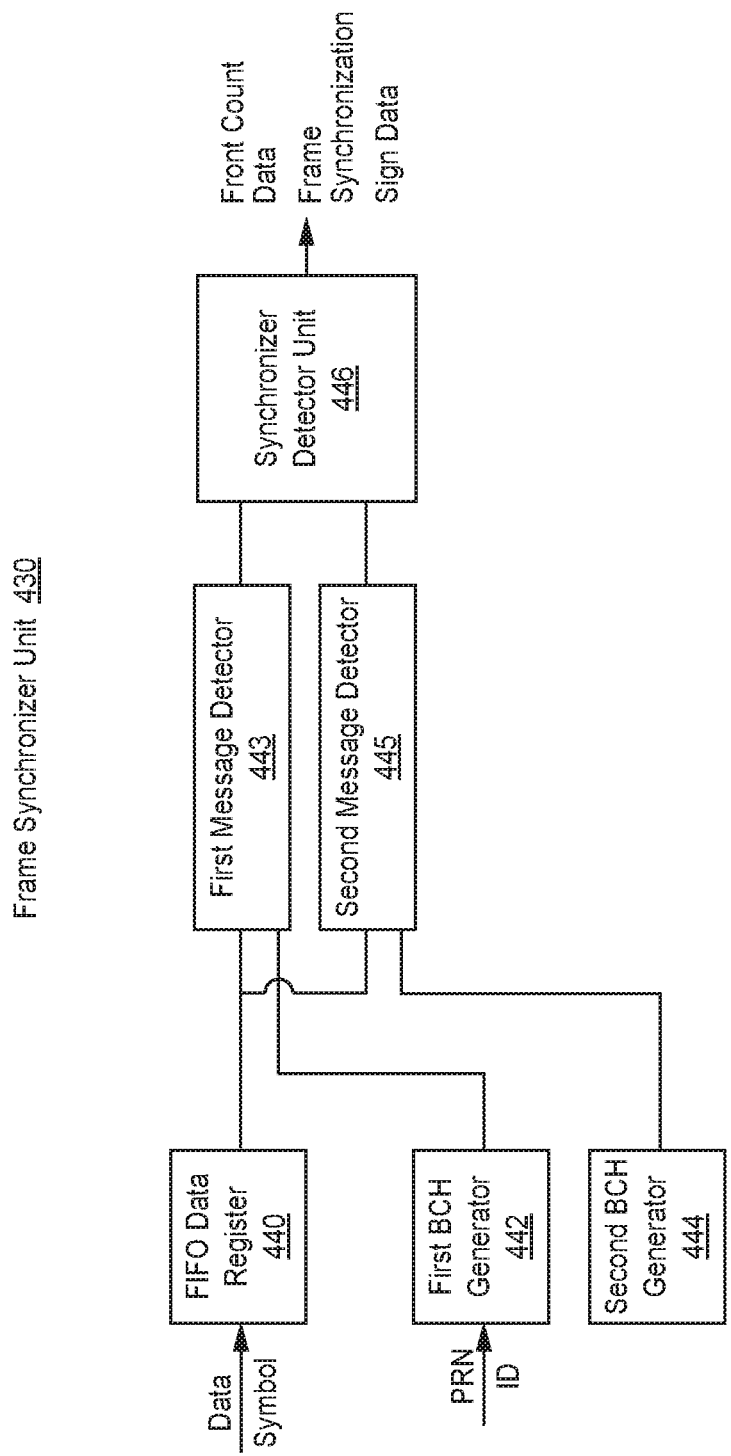
FIG. 4 illustrates one embodiment of an exemplary frame synchronizer unit employing PRN and SOH consistency testing for a GNSS receiver.

FIG. 4 illustrates one embodiment of an exemplary frame synchronizer unit 430 employing PRN and SOH consistency testing for a GNSS receiver, e.g. a BeiDou GNSS receiver. The frame synchronizer unit 430 comprises a first in first out (FIFO) data registers 440, a first BCH generator 442, a first message detector 443, and a synchronization detector unit 446. Optionally, the frame synchronizer unit 430 includes a second BCH generator 444 and a second message detector 445.

The frame synchronizer unit 430 includes a synchronization detector unit 446. The synchronization detector unit 446 determines whether the both the first message detector 443 and the second message detector 445 have detected respectively the encoded PRN identifier and the encoded SOH.

For a GPS GNSS receiver, the optional second BCH generator 444 and the SOH for a block of data optional second message detector 445 are not needed. Only, the first BCH generator 442 and the first message detector 443 are used to synchronize to TOI in a manner analogous to that described below for SOH. In this case, the input of the frame synchronizer unit 446 is configured only to be coupled to the output of the first message detector 443.

The BeiDou GNSS receiver is further implemented as follows. An input of the FIFO data registers 330 is configured to be coupled to an output of the corresponding tracking unit, and receive the data symbol. The FIFO data registers 330 act as a data buffer between the first message detector 333 (and the optional second message detector 334), and an output of the corresponding tracking unit. In one embodiment, the FIFO data registers 440 stores n bits, where the first sub-frame of the BCH encoded data symbol has n bits. The first m of the n bits comprises BCH encoded PRN. The remaining n-m bits comprises the BCH encoded SOH.

An input of the first BCH generator 442 is configured to be coupled to an output of the corresponding tracking unit and received the PRN identifier. The first BCH generator 442 generates, using BCH coding, a first look up table of a set of all combinations of m bits corresponding to a potentially received BCH encoded PRN in the BCH encoded first sub-frame of the data symbol, where each element (potentially received BCH encoded PRN or potentially received segment) of the look up table has zero bit errors. The BCH encoding used in the BCH encoded PRN in the data symbol is intended to correct for up to t bit errors. The BCH decoded PRN identifier has q bits. The expression for generating the first look up table is BCH(m,q,t). In one embodiment, m=21, q=6, and t=3 with a corresponding polynomial of $x^6+x^4+x^2+x+1$ representation based upon a selected Galois field. However, other parameters and another corresponding polynomial may be selected.

When the BCH encoded PRN is received, it is compared to the elements of the first lookup table. If the received BCH encoded PRN is similar to one of the elements but for having t or fewer bit errors, the received BCH encoded PRN is replaced by the similar element of the first lookup table.

The second BCH generator 444 generates, using BCH coding, a second look up table of a set of all combinations of the m-n bits corresponding to a potentially received BCH encoded SOH in the first sub-frame of the data symbol, where each element (potentially received BCH encoded SOH or potentially received segment) of the look up table has between zero and u bit errors. The SOH is transmitted every eighteen seconds, and therefore there are two hundred possible SOHs that can be transmitted each hour. The BCH encoding used in the BCH encoded SOH is intended to correct for up to u bit errors. The decoded SOH has r bits. The expression for generating the first look up table is BCH(n-m,r,u). In one embodiment, n-m=51, r=8, and u=11 with a corresponding polynomial of $x^8+x^7+x^4+x^3+x^2+x+1$ representation based upon a selected Galois field. However, other parameters and another corresponding polynomial may be selected.

When the BCH encoded SOH is received, it is compared to the elements of the second lookup table. If the received BCH encoded SOH is similar to one of the elements but for having u or fewer bit errors, the received BCH encoded SOH is replaced by the similar element of the second lookup table.

A first input of the first message detector 443 is configured to be coupled to the output of the FIFO data registers 440 and to receive m bits of the first n bits stored in the FIFO data registers 440. A second input of the first message detector 443 is configured to be coupled to the output of the first BCH generator 442 and receive data from the first look up table.

The following pertaining to determining repeated matches is optional; thus y and z may be zero. If the m bits from the FIFO data registers 440 is similar to (i.e. the same or having t or fewer erroneous bits) one of the elements (potentially received segments) in the first look up table, then determine whether there is a match for the same subset of bits in each of the next y successive frames, where y is an integer greater than or equal to one, and may be selected by the system designer. If there is a match for the same set for the next y frames, then location of the PRN in the data symbol is obtained and can be used for sub-frame synchronization. The first message detector 443 generates a PRN flag indicating that synchronization to the BCH encoded PRN has been achieved.

If there is no match, the first message detector 443 generates a PRN flag indicating that synchronization to the BCH encoded PRN has not been achieved. Then, the next set of data (i.e. ranging from bit a+1 to bit b+1) is so analyzed. The next set of error corrected coded data is formed by dropping the first bit and adding the bit of the error corrected coded data following the last bit of the set. For example, this may be performed using FIFO registers.

The second message detector 445 is configured to be coupled to the output of the FIFO data registers 440 and to receive m-n bits of the last n bits stored in the FIFO data registers 440. The second message detector 445 is also configured to be coupled to the output of the second BCH generator 444 and receive the second look up table.

If the m-n bits FIFO data registers is similar to (i.e. the same or having u or fewer erroneous bits) one of the elements (possibly received segments) in the second look up table, then for z successive frames, determine whether there is a match for the same subset of bits, where z is an integer greater than or equal to one, and may be selected by the system designer. If there is a match for the same set for the next z frames, then location of the SOH in the data symbol is obtained and can be used for sub-frame synchronization. The location of the first bit of successive sub-frames can be determined because the bit length of each sub-frame is known. The second message detector 445 generates a SOH flag indicating that synchronization to the BCH encoded SOH has been achieved.

In one embodiment, y and z are the same parameter; if initially both the m bits and the m-n bits of the FIFO data registers 440 are the same respectively as one of the elements in the first look up table and one of the elements in the second look up table, the analysis with respect to both the PRN identifier and SOH is repeated for y frames. Alternatively, y and z are different parameters; before SOH synchronization is determined z time, PRN identifier synchronization must be determined y times.

The synchronization detector 446 is configured to be coupled to the outputs of the first message detector 443 and the second message detector 445. The synchronization detector unit 446 generates at its output the frame count data and the frame synchronization sign data. The frame synchronization sign data indicates synchronization only if both the first message detector 443 and the second message detector 445 generate flags indications synchronization. (For a GPS receiver, the frame synchronization sign data indicates synchronization when the first message detector generates a flag indicating synchronization.) When frame synchronization is achieved, the synchronization detector 446 provides the frame count data and indicates synchronization with the frame synchronization sign data.

Returning to FIG. 3, the navigation message extractor unit 332 will now be described. Inputs of the navigation message extractor unit 332 are configured to receive the data symbol, the PRN identifier, and the frame count data and frame synchronization data output from the frame synchronizer unit 330. When the frame synchronization data indicates sub-frame synchronization (as described above), the navigation message extractor unit 332 identifies the sub-frames in the frame of encoded data in the data symbol. The navigation message extractor unit 332 applies the corresponding error correction decoding to each sub-frame or portions thereof. Thus, BCH decoding (comparable to the BCH coding used to create the table(s) described above) is used to decode the first sub-frame, or portions thereof. Other type of decoding, such as low density parity check decoding may be applied to other sub-frames of the frame that are so encoded. Upon decoding sub-frame data, a decoding status flag is set at the output of the navigation message extractor unit 332 (and thus the decoder unit 322) to indicate decoding has occurred. The PRN identifier (supplied to the decoder unit 322) are decoded navigation message (including time and satellite position) also provided at the output of the navigation message extractor unit 332 (and thus the decoder unit 322). The foregoing information is provided to the position, velocity, and time determination unit 105c.

Figure 5:
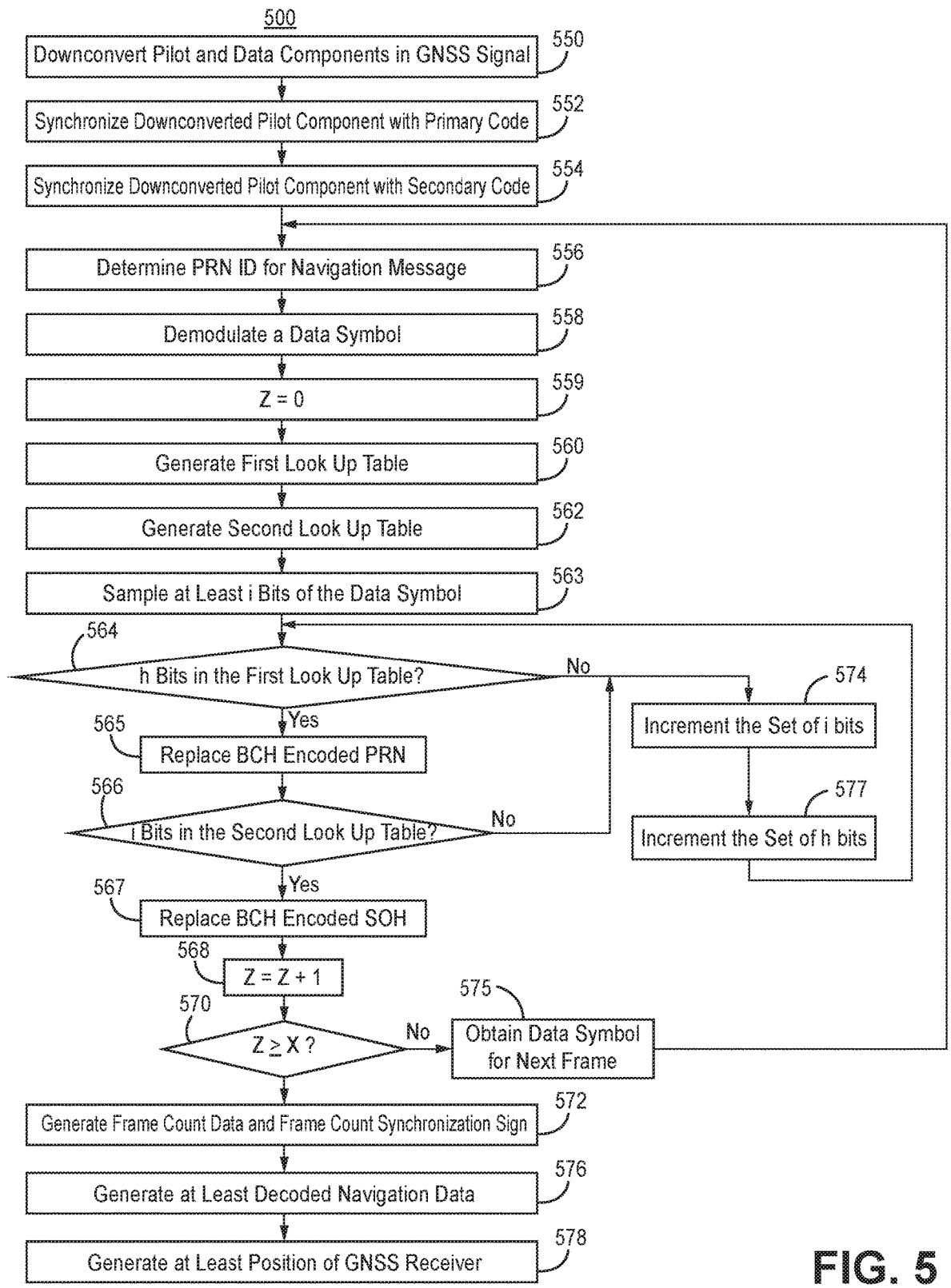
FIG. 5 illustrates an exemplary method of operation of a GNSS receiver employing consistency testing for a BCH error corrected first sub-frame of navigation message broadcast from a satellite of a GNSS.

FIG. 5 illustrates an exemplary method 500 of operation of a GNSS receiver employing consistency testing for a BCH error corrected first sub-frame of navigation message broadcast from a satellite of a GNSS. To the extent the method 500 shown in FIG. 5 is described herein as being implemented in the devices described above with respect to FIGS. 1-4, it is to be understood that other embodiments can be implemented in other ways. The blocks of the flow diagrams have been arranged in a generally sequential manner for ease of explanation; however, it is to be understood that this arrangement is merely exemplary, and it should be recognized that the processing associated with the methods (and the blocks shown in the Figures) can occur in a different order (for example, where at least some of the processing associated with the blocks is performed in parallel and/or in an event-driven manner).

In block 550, downconvert the pilot and data components in GNSS signal transmitted from a satellite of a GNSS. In block 552, synchronize the downconverted pilot component with a primary code of a PRN ranging code. In block 554, synchronize the downconverted pilot component with a secondary code of the PRN ranging code. In block 556, determine the pseudorandom noise identifier for the data component which uniquely corresponds to the satellite, Doppler data of the satellite, and primary code chip data. In block 558, demodulate a data symbol from the downconverted data component. Optionally, in block 559, set Z=0.

In block 560, generate, using BCH coding, a first look up table of a set of all possible combinations of i bits of potentially received BCH encoded time information having zero bit errors. The potentially received BCH encoded time information are in a first sub-frame of a frame of the downconverted data component. The first sub-frame includes time information which may be SOH or TOI. If optional block 562 is not used, proceed to block 563 and later skip block 564.

Optionally, in block 562, generate using BCH coding, a second look up table of a set of all combinations of h bits corresponding to a potentially received BCH encoded PRN identifier having zero bit errors. Optionally, the first sub-frame includes a BCH encoded PRN identifier and a BCH time information, e.g. SOH; for pedagogical reasons, BCH SOH will be exemplified.

In block 563, sample at least i bits of the data symbol. For example, if the first sub-frame only includes a BCH encoded SOH of i bits, then sample i bits. For example, if the first sub-frame includes a BCH encoded PRN of h bits and a BCH encoded SOH of i bits, then sample at least h+i bits. Note, the BCH encoded TOI and the BCH encoded SOH may have a different number of bits.

Optionally, if a BCH encoded PRN identifier is used, in block 564, determine if a set of h bits (from bit a to bit b-1) of the data symbol is similar to one of the elements of the first look up table but for having t or fewer bit errors, where the first sub-frame has h+i bits. Bit a may be the first bit of the first sub-frame. If block 564 is not optionally used, proceed to block 566.

If the set of h bits of the data symbol is determined to be similar to an element in the first look up table but for having t or fewer bit errors, then in optional block 565 replace the received BCH encoded PRN with the similar element of the first lookup table. Block 565 need not be performed if the data symbol is determined to be not only similar but also identical to an element in the first look up table. Then, proceed to block 568 (or optionally block 566 if the first sub-frame includes a BCH encoded PRN identifier). If the set of h bits of the data symbol is determined not to similar to one of the elements of the first look up table, then proceed to block 574.

In block 566, determine if a set of a i bits (from bit b to bit c) of the data symbol is similar to one of the elements of the second look table but for having u or fewer bit errors. Bit b and bit c may be the first and last bits of the first sub-frame. Bit b alternatively may be a bit somewhere between the first and last bits. The set of i bits corresponds to BCH encoded time information. Optionally, if the first sub-frame does not include a BCH encoded PRN identifier, the first sub-frame has i bits.

If the set of i bits of the data symbol is determined to be similar to an element in the second look up table, then in block 567 replace the received BCH encoded SOH with the similar element of the second lookup table. Then, proceed to block 572 or optionally block 568. If the set of i bits of the data symbol is determined not to be similar to one of the elements of the second look up table, then proceed to block 574.

Blocks 559, 568, and 570 are optional. Optionally in block 568, set Z=Z+1. In optional block 570, determine if Z is greater than or equal to X, where X is an integer and the number of successive frames for which blocks 566 (and optionally 564) must achieve a successful determination. Z is chosen by a system designer, e.g. of the GNSS receiver. If X is greater than or equal Z, then proceed to block 572. If X is not greater than or equal to Z, then in block 575 obtain a data symbol for the next successive frame, and return to block 566 (or optionally block 564 if the first sub-frame includes a BCH encoded PRN identifier). In block 572, generate frame count data and frame synchronization sign data, and proceed to block 576. Note, in some embodiments, block 572 is optional.

In block 574, increment the set of i bits by one bit to range from bit b+1 to bit c+1. Optionally if the first sub-frame includes a BCH encoded PRN identifier, then in block 577 increment the corresponding h bits by one bit to range from bit a+1 to bit b. Then, return to block 564.

In block 576, generate at least a decoded navigation message (and possibly decoding status) based upon the frame count data and the frame synchronization data. In block 578, generate at least a position of a GNSS receiver (and possibly velocity of the GNSS receiver and/or time) using at least the decoded navigation message. The navigation message of all or some of the received GNSS satellite signals may be used.

The processing circuitry described herein may include one or more microprocessors, microcontrollers, digital signal processing (DSP) elements, application-specific integrated circuits (ASICs), complex programmable logic devices, field programmable gate arrays (FPGAs), and/or memory circuitry. In this exemplary embodiment, processing circuitry includes or functions with software programs, firmware, or other computer readable instructions for carrying out various process tasks, calculations, and control functions, used in the methods described herein. These instructions are typically tangibly embodied on any storage media (or computer readable medium) used for storage of computer readable instructions or data structures. Alternatively, all or part of the processing circuitry may be implemented with analog processing circuitry, e.g. implemented with operational amplifier(s).

The memory circuitry described herein can be implemented with any available storage media (or computer readable media) that can be accessed by a general purpose or special purpose computer or processor, or any programmable logic device. Suitable computer readable medium may include storage or memory media such as semiconductor, magnetic, and/or optical media. For example, computer readable media may include conventional hard disks, Compact Disk—Read Only Memory (CD-ROM), DVDs, volatile or non-volatile media such as Random Access Memory (RAM) (including, but not limited to, Dynamic Random Access Memory (DRAM)), Read Only Memory (ROM), Electrically Erasable Programmable ROM (EEPROM), and/or flash memory. Combinations of the above are also included within the scope of computer readable media.

EXAMPLE EMBODIMENTS

Example includes a method performed by a global navigation satellite system (GNSS) receiver, comprising: receiving a pilot component and a data component of a signal from a satellite of a GNSS, where the pilot component comprises a unique primary code and a secondary code; wherein the data component comprises a carrier signal encoded with a primary pseudorandom noise (PRN) ranging code and a navigation message; wherein the navigation message comprises frames of data, where each frame comprises at least one sub-frame, and where the at least one sub-frame comprises Bose-Chaudhuri-Hocquenghem (BCH) encoded time information; downconverting the signal; synchronizing to the downconverted pilot component with the primary code; synchronizing to the downconverted pilot component with the secondary code; synchronizing to the secondary code in the downconverted pilot signal; generating a first look up table of a set of all combinations of a potentially received BCH encoded time information in a first sub-frame, where each potentially received BCH encoded time information has from zero to u bit errors; sampling at least i bits of the navigation message; determining if i bits of the sampled at least i bits is an element in the first look up table; and if the i bits is an element, then determining that the frame is synchronized.

Example 2 includes the method of Example 1, wherein the first sub-frame further comprises a PRN identifier uniquely corresponding to the satellite, and further comprises: generating a second look up table of a set of all combinations of a potentially received BCH encoded PRN identifiers in the first sub-frame, where each potentially received BCH encoded time information has from zero to t bit errors; wherein sampling at least i bits of the navigation message comprises sampling at least h+i bits of the navigation message; determining if h bits of the sampled at least h+i bits is an element in the second look up table; and wherein if the i bits is an element, then determining that the frame is synchronized comprises if the i bits is an element of the first look up table and the h bits is an element of the second look up table, then determining that the frame is synchronized.

Example 3 includes the method of any of Examples 1-2, where time information is second of the hour or time of interval.

Example 4 includes the method of any of Examples 1-3, further comprising decoding navigation message after determining that there has been frame synchronization.

Example 5 includes the method of Example 4, further comprising determining at least one of position of a GNSS receiver, a velocity of the GNSS receiver, and time.

Example 6 includes the method of any of examples 1-5, wherein the PRN identifier is determined from the primary code used to synchronize the pilot signal.

Example 7 includes the method of any of examples 1-6, wherein the frame comprises at least a second frame of encoded data.

Example 8 includes the method of example 7, wherein the second frame is encoded and decoded using low-density parity-check coding.

Example 9 includes a method performed by a global navigation satellite system (GNSS) receiver, comprising: downconverting a pilot component and a data component of a GNSS satellite signal, where the pilot signal comprises a carrier signal encoded with a unique pseudorandom noise (PRN) ranging code, and where the PRN ranging code comprises a primary code, unique to a corresponding satellite, and a secondary code; wherein the data component comprises a carrier signal encoded with a primary pseudorandom noise (PRN) ranging code and a navigation message; synchronizing a downconverted pilot component with the primary code; synchronizing the downconverted pilot component with the secondary code; determining a PRN identifier for the navigation message; demodulating a data symbol from the navigation message; generating, using Bose-Chaudhuri-Hocquenghem (BCH) coding, a first look up table of a set of all possible combinations of potentially received BCH encoded time information having zero bit errors, where the potentially received BCH encoded time information are in a first sub-frame of a frame of the navigation message; sampling at least i bits of the data symbol; determining if a set of i bits, from bit b to bit c, of the data symbol similar to an element in the first look up table but for having u or fewer bit errors, where he set of i bits corresponds to BCH encoded time information; generating frame count data and frame synchronization data; if the set of i bits corresponds is similar to an element in the first look up table, then generating at least a decoded navigation message based upon the frame count data and the frame synchronization sign data; generating at least a position of a GNSS satellite using at least the decoded navigation message; and if the set of i bits of the data symbol is determined not to be an element in the first look up table, then incrementing the set of i bits by one bit to range from bit b+1 to bit c+1 of the data symbol.

Example 10 includes the method of Example 9, further comprising if the set of i bits of the data symbol is determined to be similar to an element in the first look up table, then replace the received BCH encoded time information with the similar element of the first lookup table.

Example 11 includes the method of example 9, wherein the first sub-frame further comprises a pseudorandom noise (PRN) identifier uniquely corresponding to the satellite, and further comprising: generating, using BCH coding a second look up table of a set of all combinations of a potentially received BCH encoded PRN identifiers having zero bit errors, where the potentially received BCH encoded time information are in a first sub-frame of a frame of the navigation message; wherein sampling at least i bits of the data symbol comprises sampling at least h+i bits of the data symbol; determining if a set of h bits, from bit a to bit b-1, of the data symbol is similar to an element in the second look up table but having t or fewer bit errors, where the set of h bits corresponds to BCH encoded PRN identifier; if the set of i bits of the data symbol is determined to be similar to an element in the first look up table comprises if the set of i bits of the data symbol is determined to be similar to an element in the first look up table and if the set of h bits of the data symbol is determined to be similar to an element in the second look up table, then generating the at least decoded navigation message based upon the frame count data and the frame synchronization sign data; and if the set of i bits of the data symbol is determined not to be an element in the first look up table comprises if the set of i bits of the data symbol is determined not to be similar to an element in the first look up table or if the set of h bits of the data symbol is determined not to be similar to an element in the second look up table, then incrementing the set of i bits by one bit to range from bit b+1 to bit c+1 of the data symbol and incrementing the set of h bits by one bit to range from bit a+1 to bit b.

Example 12 includes the method of example 11, further comprising if the set of h bits of the data symbol is determined to be similar to an element in the second look up table, then replacing the received BCH encoded PRN with the similar element of the first lookup table.

Example 13 includes the method of any of examples 9-12, wherein the PRN identifier is determined from the primary code used to synchronize the pilot signal.

Example 14 includes the method of any of examples 9-13, wherein the frame comprises at least a second frame of encoded data.

Example 15 includes a global navigation satellite system (GNSS) receiver, comprising: a low noise amplifier comprising an input and an output, where the input is configured to receive a GNSS satellite signal comprising a pilot component and a data component, and where the input is configured to be coupled to an antenna; wherein each pilot component comprises a carrier encoded with a pseudorandom noise (PRN) ranging code comprising a primary code, unique to a corresponding satellite, and a secondary code; wherein the data component comprises a carrier signal encoded with a primary pseudorandom noise (PRN) ranging code and a navigation message; a downconverter comprising a first input, a second input, and an output, where the first input is coupled to the output of the low noise amplifier, and where the output is configured to provide a downconverted pilot component and a downconverted data component; a local oscillator comprising an output which is coupled to the second input of the downconverter; and processing circuitry, comprising at least one channel, configured to: synchronize the downconverted pilot component with the primary code; synchronize the downconverted pilot component with the secondary code; determine a PRN identifier for the navigation message; demodulate a data symbol from the navigation message; generate, using Bose-Chaudhuri-Hocquenghem (BCH) coding, a first look up table of a set of all possible combinations of potentially received BCH encoded time information having zero bit errors, where the potentially received BCH encoded time information are in a first sub-frame of a frame of the navigation message; sample at least i bits of the data symbol; determine if a set of i bits, from bit b to bit c, of the data symbol similar to an element in the first look up table but for having u or fewer bit errors, where he set of i bits corresponds to BCH encoded time information; generate frame count data and frame synchronization data; if the set of i bits corresponds is similar to an element in the first look up table, then generate at least a decoded navigation message based upon the frame count data and the frame synchronization sign data; generate at least a position of a GNSS satellite using at least the decoded navigation message; and if the set of i bits of the data symbol is determined not to be an element in the first look up table, then increment the set of i bits by one bit to range from bit b+1 to bit c+1 of the data symbol.

Example 16 includes the GNSS receiver of Example 15, wherein the processing circuitry is further configured to: if the set of h bits of the data symbol is determined to be similar to an element in the second look up table, then replace the received BCH encoded PRN with the similar element of the first lookup table.

Example 17 includes the GNSS receiver of any of examples 15-16, wherein the first sub-frame further comprises a pseudorandom noise (PRN) identifier uniquely corresponding to the satellite, and the processing circuitry is further configured to: generate, using BCH coding a second look up table of a set of all combinations of a potentially received BCH encoded PRN identifiers having zero bit errors, where the potentially received BCH encoded time information are in a first sub-frame of a frame of the navigation message; wherein sample at least i bits of the data symbol comprises sample at least h+i bits of the data symbol; determine if a set of h bits, from bit a to bit b-1, of the data symbol is similar to an element in the second look up table but having t or fewer bit errors, where the set of h bits corresponds to BCH encoded PRN identifier; if the set of i bits of the data symbol is determined to be similar to an element in the first look up table comprises if the set of i bits of the data symbol is determined to be similar to an element in the first look up table and if the set of h bits of the data symbol is determined to be similar to an element in the second look up table, then generate the at least decoded navigation message based upon the frame count data and the frame synchronization sign data; and if the set of i bits of the data symbol is determined not to be an element in the first look up table comprises if the set of i bits of the data symbol is determined not to be similar to an element in the first look up table or if the set of h bits of the data symbol is determined not to be similar to an element in the second look up table, then increment the set of i bits by one bit to range from bit b+1 to bit c+1 of the data symbol and incrementing the set of h bits by one bit to range from bit a+1 to bit b.

Example 18 includes the GNSS receiver of any of examples 15-17, wherein the processing circuitry is further configured to: if the set of h bits of the data symbol is determined to be similar to an element in the second look up table, then replace the received BCH encoded PRN with the similar element of the first lookup table.

Example 19 includes the GNSS receiver of any of examples 15-18, wherein the PRN identifier is determined from the primary code used to synchronize the pilot signal.

Example 120 includes the GNSS receiver of any of examples 15-19, wherein the frame comprises at least a second frame of encoded data.

A number of examples defined by the following claims have been described. Nevertheless, it will be understood that various modifications to the described examples may be made without departing from the spirit and scope of the claimed invention. Therefore, it is manifestly intended that this invention be limited only by the claims and the equivalents thereof.

What is claimed is:

1. A method performed by a global navigation satellite system (GNSS) receiver, comprising:
downconverting a pilot component and a data component of a GNSS satellite signal, where the pilot signal comprises a carrier signal encoded with a unique pseudorandom noise (PRN) ranging code, and where the PRN ranging code comprises a primary code, unique to a corresponding satellite, and a secondary code;
wherein the data component comprises a carrier signal encoded with a primary pseudorandom noise (PRN) ranging code and a navigation message;
synchronizing a downconverted pilot component with the primary code;
synchronizing the downconverted pilot component with the secondary code;
determining a PRN identifier for the navigation message;
demodulating a data symbol from the navigation message;
generating, using Bose-Chaudhuri-Hocquenghem (BCH) coding, a first look up table of a set of all possible combinations of potentially received BCH encoded time information having zero bit errors, where the potentially received BCH encoded time information are in a first sub-frame of a frame of the navigation message;
sampling at least i bits of the data symbol;
determining if a set of i bits, from bit b to bit c, of the data symbol similar to an element in the first look up table but for having u or fewer bit errors, where the set of i bits corresponds to BCH encoded time information;
generating frame count data and frame synchronization data;
if the set of i bits corresponds is similar to an element in the first look up table, then generating at least a decoded navigation message based upon the frame count data and the frame synchronization sign data;
generating at least a position of a GNSS satellite using at least the decoded navigation message; and
if the set of i bits of the data symbol is determined not to be an element in the first look up table, then incrementing the set of i bits by one bit to range from bit b+1 to bit c+1 of the data symbol.

2. The method of claim 1, further comprising if the set of i bits of the data symbol is determined to be similar to an element in the first look up table, then replace the received BCH encoded time information with the similar element of the first lookup table.

3. The method of claim 1, wherein the first sub-frame further comprises a pseudorandom noise (PRN) identifier uniquely corresponding to the satellite, and further comprising:
generating, using BCH coding a second look up table of a set of all combinations of a potentially received BCH encoded PRN identifiers having zero bit errors, where the potentially received BCH encoded time information are in a first sub-frame of a frame of the navigation message;
wherein sampling at least i bits of the data symbol comprises sampling at least h+i bits of the data symbol;
determining if a set of h bits, from bit a to bit b-1, of the data symbol is similar to an element in the second look up table but having t or fewer bit errors, where the set of h bits corresponds to BCH encoded PRN identifier;
if the set of i bits of the data symbol is determined to be similar to an element in the first look up table comprises if the set of i bits of the data symbol is determined to be similar to an element in the first look up table and if the set of h bits of the data symbol is determined to be similar to an element in the second look up table, then generating the at least decoded navigation message based upon the frame count data and the frame synchronization sign data; and
if the set of i bits of the data symbol is determined not to be an element in the first look up table comprises if the set of i bits of the data symbol is determined not to be similar to an element in the first look up table or if the set of h bits of the data symbol is determined not to be similar to an element in the second look up table, then incrementing the set of i bits by one bit to range from bit b+1 to bit c+1 of the data symbol and incrementing the set of h bits by one bit to range from bit a+1 to bit b.

4. The method of claim 3, further comprising if the set of h bits of the data symbol is determined to be similar to an element in the second look up table, then replacing the received BCH encoded PRN with the similar element of the second lookup table.

5. The method of claim 1, wherein the PRN identifier is determined from the primary code used to synchronize the pilot signal.

6. The method of claim 1, wherein the frame comprises at least a second frame of encoded data.

7. The method of claim 6, wherein the second frame is decoded using low-density parity-check coding.

8. The method of claim 1, where time information is second of an hour or time of interval.

9. A global navigation satellite system (GNSS) receiver, comprising:
- a low noise amplifier comprising an input and an output, where the input is configured to receive a GNSS satellite signal comprising a pilot component and a data component, and where the input is configured to be coupled to an antenna;
- wherein each pilot component comprises a carrier encoded with a pseudorandom noise (PRN) ranging code comprising a primary code, unique to a corresponding satellite, and a secondary code;
- wherein the data component comprises a carrier signal encoded with a primary pseudorandom noise (PRN) ranging code and a navigation message;
- a downconverter comprising a first input, a second input, and an output, where the first input is coupled to the output of the low noise amplifier, and where the output is configured to provide a downconverted pilot component and a downconverted data component;
- a local oscillator comprising an output which is coupled to the second input of the downconverter; and
- processing circuitry, comprising at least one channel, configured to:
  - synchronize the downconverted pilot component with the primary code;
  - synchronize the downconverted pilot component with the secondary code;
  - determine a PRN identifier for the navigation message;
  - demodulate a data symbol from the navigation message;
  - generate, using Bose-Chaudhuri-Hocquenghem (BCH) coding, a first look up table of a set of all possible combinations of potentially received BCH encoded time information having zero bit errors, where the potentially received BCH encoded time information are in a first sub-frame of a frame of the navigation message;
  - sample at least i bits of the data symbol;
  - determine if a set of i bits, from bit b to bit c, of the data symbol similar to an element in the first look up table but for having u or fewer bit errors, where the set of i bits corresponds to BCH encoded time information;
  - generate frame count data and frame synchronization data;
  - if the set of i bits corresponds is similar to an element in the first look up table, then generate at least a decoded navigation message based upon the frame count data and the frame synchronization sign data;
  - generate at least a position of a GNSS satellite using at least the decoded navigation message; and
  - if the set of i bits of the data symbol is determined not to be an element in the first look up table, then increment the set of i bits by one bit to range from bit b+1 to bit c+1 of the data symbol.

10. The GNSS receiver of claim 9, wherein the processing circuitry is further configured to: if the set of h bits of the data symbol is determined to be similar to an element in the second look up table, then replace the received BCH encoded PRN with the similar element of the second lookup table.

11. The GNSS receiver of claim 9, wherein the first sub-frame further comprises a pseudorandom noise (PRN) identifier uniquely corresponding to the satellite, and the processing circuitry is further configured to:
- generate, using BCH coding a second look up table of a set of all combinations of a potentially received BCH encoded PRN identifiers having zero bit errors, where the potentially received BCH encoded time information are in a first sub-frame of a frame of the navigation message;
- wherein sample at least i bits of the data symbol comprises sample at least h+i bits of the data symbol;
- determine if a set of h bits, from bit a to bit b-1, of the data symbol is similar to an element in the second look up table but having t or fewer bit errors, where the set of h bits corresponds to BCH encoded PRN identifier;
- if the set of i bits of the data symbol is determined to be similar to an element in the first look up table comprises if the set of i bits of the data symbol is determined to be similar to an element in the first look up table and if the set of h bits of the data symbol is determined to be similar to an element in the second look up table, then generate the at least decoded navigation message based upon the frame count data and the frame synchronization sign data; and
- if the set of i bits of the data symbol is determined not to be an element in the first look up table comprises if the set of i bits of the data symbol is determined not to be similar to an element in the first look up table or if the set of h bits of the data symbol is determined not to be similar to an element in the second look up table, then increment the set of i bits by one bit to range from bit b+1 to bit c+1 of the data symbol and incrementing the set of h bits by one bit to range from bit a+1 to bit b.

12. The GNSS receiver of claim 9, wherein the processing circuitry is further configured to: if the set of h bits of the data symbol is determined to be similar to an element in the second look up table, then replace the received BCH encoded PRN with the similar element of the second lookup table.

13. The GNSS receiver of claim 9, wherein the PRN identifier is determined from the primary code used to synchronize the pilot signal.

14. The GNSS receiver of claim 9, wherein the frame comprises at least a second frame of encoded data.

15. The GNSS receiver of claim 14, wherein the processing circuit is further configured to decode the second frame using low-density parity-checking coding.

16. The GNSS receiver of claim 9, where time information is second of an hour or time of interval.

* * * * *